(12) United States Patent
Takabayashi

(10) Patent No.: US 6,208,408 B1
(45) Date of Patent: *Mar. 27, 2001

(54) PROJECTION EXPOSURE APPARATUS AND DEVICE MANUFACTURING METHOD

(75) Inventor: Yukio Takabayashi, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/063,403

(22) Filed: Apr. 21, 1998

(30) Foreign Application Priority Data

Apr. 22, 1997  (JP) .................................................. 9-117408

(51) Int. Cl.$^7$ ............................ G03B 27/42; G03B 27/54; G03B 27/32
(52) U.S. Cl. ................................ 355/67; 355/53; 355/77
(58) Field of Search .................................. 355/30, 53, 67, 355/74, 75, 77

(56) References Cited

U.S. PATENT DOCUMENTS

| | | | | |
|---|---|---|---|---|
| 4,659,225 | * | 4/1987 | Takahashi | 356/358 |
| 4,669,842 | * | 6/1987 | Yomoda et al. | 353/101 |
| 4,766,465 | * | 8/1988 | Takahashi | 355/53 |
| 5,658,700 | * | 8/1997 | Sakai | 430/30 |
| 5,691,806 | * | 11/1997 | Tokuda et al. | 355/72 |
| 5,781,277 | * | 7/1998 | Iwamoto | 355/53 |
| 5,822,043 | * | 10/1998 | Ebinuma | 355/55 |

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

A projection exposure apparatus includes an original table for holding an original having a pattern to be transferred, a projection optical system, a substrate stage for holding a substrate to be exposed through the projection optical system, and a supporting member for supporting the projection optical system, wherein at least a portion of the supporting member is made of one of a ceramics material and a compound material provided by integrally sintering a ceramics material and a metal material.

18 Claims, 10 Drawing Sheets

PROJECTION EXPOSURE APPARATUS AND DEVICE MANUFACTURING METHOD

FIELD OF THE INVENTION AND RELATED ART

This invention relates to a projection exposure apparatus for exposure of a substrate such as a wafer, for example, for manufacture of semiconductor devices, for example.

FIG. 9 shows a projection exposure apparatus for use in the manufacture of semiconductor devices, for example, and it includes a wafer stage 101 for positioning a wafer $W_0$, a projection lens 102 disposed above the wafer stage, a reticle stage 103 and a light source optical system 106. The light source optical system 106 produces exposure light which passes a reticle $R_0$ placed on the reticle stage 103. The light is then collected by the projection lens 102 onto the wafer $W_0$, whereby a pattern of the reticle $R_0$ is transferred to the wafer $W_0$.

The wafer stage 101 is supported at the central portion of a base 101a which is supported on the floor through an anti-vibration system 101b. At the outside peripheral portion of the base 101a, there is a cast frame 105 supported in an upstanding position. The top 105a of the frame 105 supports the projection lens 102 at the center, and also it supports at the outer portion a reticle stage supporting member 104 (for supporting the reticle stage 103) as well as a light source optical system supporting member 106a, in an upstanding position.

The position of the wafer stage 101 is measured optically and without contact, by means of a laser interferometer 107 which is supported by the frame 105. Similarly, the position of the reticle stage 103 is measured by another laser interferometer 108.

Each of the frame 105, the reticle stage supporting member 104, the base 101a, and the light source optical system supporting member 106a is a structural supporting member, and they support the projection lens 102, the reticle stage 103, the light source optical system 106, and the position measuring system. Thus, sufficient rigidity is required for them so as to prevent not only vibration but also deformation due to a movement load of the stage.

In semiconductor device manufacture, the size or diameter of a substrate has been enlarged more and more for further improvement of productivity. Currently, the device manufacture mainly uses 8-inch size silicon wafers, but 12-inch size wafers will be used soon. If the substrate size becomes 1.5 times larger, the stroke of a movement member such as a stage becomes longer correspondingly. The moving load of a movement member causes not a small deformation of a supporting structural member, and, with enlargement of the stroke of the movement member, the amount of such deformation increases. Particularly, if deformation occurs at the mount of a laser interferometer which measures a relative shift of the projection lens and the stage, an error is produced in measurement of the stage position which directly deteriorates the precision.

Moreover, enlargement of the stroke leads to an increase in size of the stage, and this necessitates enlargement of the size of a frame that supports the stage. In order to retain a similar frame rigidity, it is necessary to modify the shape, for example, such as making the thickness 1.5 times larger, for example. Consequently, there occurs a problem of enlargement of the system as a whole and increases in weight thereof.

Conventionally, cast iron is mainly used for the structural member as a supporting member. Since cast iron has several conveniences such as a large freedom in shape and low production cost, it is used widely as a material for a structural member. On the other hand, cast iron has a Young's modulus of 110 GPa which is relatively low as a metal material. Also, there are additional negative factors when used in an exposure apparatus, such as changeability of shape with time due to loosening of internal stress or thermal expansion caused by heat, for example.

SUMMARY OF THE INVENTION

It is a primary object of the present invention to provide a solution for a problem to be caused when a supporting member for supporting a table for an original, a projection optical system or a substrate stage is made of cast iron.

In accordance with an aspect of the present invention to achieve the primary object above, a ceramics material which is light in weight and which has a high rigidity and a good shape stability is used for a supporting structural member. Examples usable as such ceramics material are alumina ceramics ($Al_2O_3$) which is cheap and has a good machining property, silicon carbide ceramics (SiC) having good heat conductivity, silicon nitride ($Si_3N_4$) having a good thermal expansion characteristic, and aluminum nitride (AlN).

The cast iron having been conventionally used as a supporting member has a Young's modulus of about 110–130 GPa and a specific gravity of 7.8. When alumina ceramics are used as the material therefor, a Young's modulus of 370 GPa and a specific gravity of 3.4 are provided. Namely, the Young's modulus increases about three times and the specific gravity becomes about a half. For the same shape, a three-times larger Young's modulus and a half weight can be established, which accomplishes light weight and high rigidity. Further, in regard to thermal expansion which may result in deterioration of precision of the exposure apparatus, it will become about ⅔ as compared with the case of cast iron. This contributes to improvement of precision.

However, although use of ceramics material for a supporting structural member in a projection exposure apparatus may easily accomplish light weight and high rigidity, for the reason that the ceramics is a brittle material, the breaking strength is about ⅓ that of cast iron. As is known in the art, generally ceramic has such characteristics that: it comprises ion bond and a covalent bond, and the inter-atomic distance is large and the surface energy is small, so that fractional brittleness breakage occurs.

Particularly, impact acceleration caused during transportation of the system applies an extraordinarily large load to a supporting member. For example, the weight to be supported by the supporting member may be 3t or more, and the largest impact acceleration to be produced during the transportation may be 30G. As a result, an enormous moment or instant load of 90t may be applied to the supporting member.

In regards to the supporting member 105 shown by hatching in FIG. 9, as illustrated in FIG. 10, an impact load FL from above the supporting member acts thereon as a tensile load, in the neighborhood of the bottom surface PC thereof. If the load is beyond the tolerance stress of the ceramics which are less resistive to a tension force, it may cause breakage of the apparatus which is very dangerous to operators.

It is a second object of the present invention to provide a ceramics supporting member having improved fraction toughness such that it is not easily broken.

In accordance with a second aspect of the present invention to achieve the second object, there is a reinforcing member for enhancing tensile strength, added to a supporting member of ceramics. More particularly, as first means, steel rods are inserted inside a ceramics material along longitudinal and lateral directions and, by sintering them together, these rods are embedded therein. Thus, by putting the tensile strength on the steel rods, the tensile stress to be applied to the ceramics is reduced. A tensile stress may be applied to the reinforcing member beforehand, and this enables that, upon deformation, a state lower than the breakage stress is maintained in response to application of an external force. As means for applying such pre-stress, in the present invention, a thermal expansion coefficient difference between the ceramics and the reinforcing member may be used.

For enhanced breakage strength, it is effective to reduce cracks (small defects or pores) in the neighborhood of the surface to which the largest tensile stress acts on. In one preferred form of the present invention, as second means, the surface of the ceramics is provided with a high purity and poreless ceramics coating to cover such pores or defects, to thereby prevent growth of cracks. Alternative means may be that a plate material having toughness and ductility, a ceramics plate material having smaller defects, or a ceramics plate material having a higher tensile strength may be adhered to the surface of the supporting material, to thereby reinforce the surface and suppress growth of cracks.

In accordance with the first means in the second aspect of the present invention, a portion of tensile stress produced during transportation of the apparatus, for example, may be borne by elongation of internally disposed metal rods. Where a sufficient contraction preload is applied beforehand, no tension force is applied to the ceramics in response to application of an external force.

In accordance with the second means described above, breakage due to growth of cracks can be prevented. Particularly, this is important to avoid micro-cracks in production of ceramics where inside defects are inevitable.

In accordance with the second aspect of the present invention which uses the two means described above, the breaking strength of the ceramics supporting member which is about ⅓ that of cast iron can be increased up to the level close to that of the cast iron.

On an occasion when a ceramics material having a low attenuation characteristic is used for a supporting structural member, high frequency vibration to be produced by motion of a movable member inside the exposure apparatus is directly propagated within the supporting member without being attenuated. For example, this may vibrate a position measuring device as external disturbance. Generally, a stage in an exposure apparatus has a resolving power of 1 nm for position measurement, and an alignment operation is made with a precision of about 0.01 micron. Thus, such vibration is at a level that cannot be disregarded, and some measure is desired to overcome high frequency vibration.

It is accordingly a third object of the present invention to prevent deterioration of position measurement precision which is attributable to a lack of attenuation of vibration on an occasion when a supporting structural member is made of ceramics.

In accordance with a third aspect of the present invention to achieve the third object, an appropriate vibration attenuation characteristic is imparted to a supporting member of ceramics.

Effective examples to be used as an attenuating element are a resin series foamed material having a high attenuation power in a raw material, a vibration suppressing steel plate member having a sandwiched resin, a rubber series paint, and sand-like particles. Such an attenuating element may be applied to the surface of ceramics, or it may be applied to inside spaces or cavities thereof, by which an assured attenuation characteristic of the supporting member is provided.

With the means described above, an initial vibration attenuation ratio of not greater than 0.2% can be increased about ten times, up to 2%.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
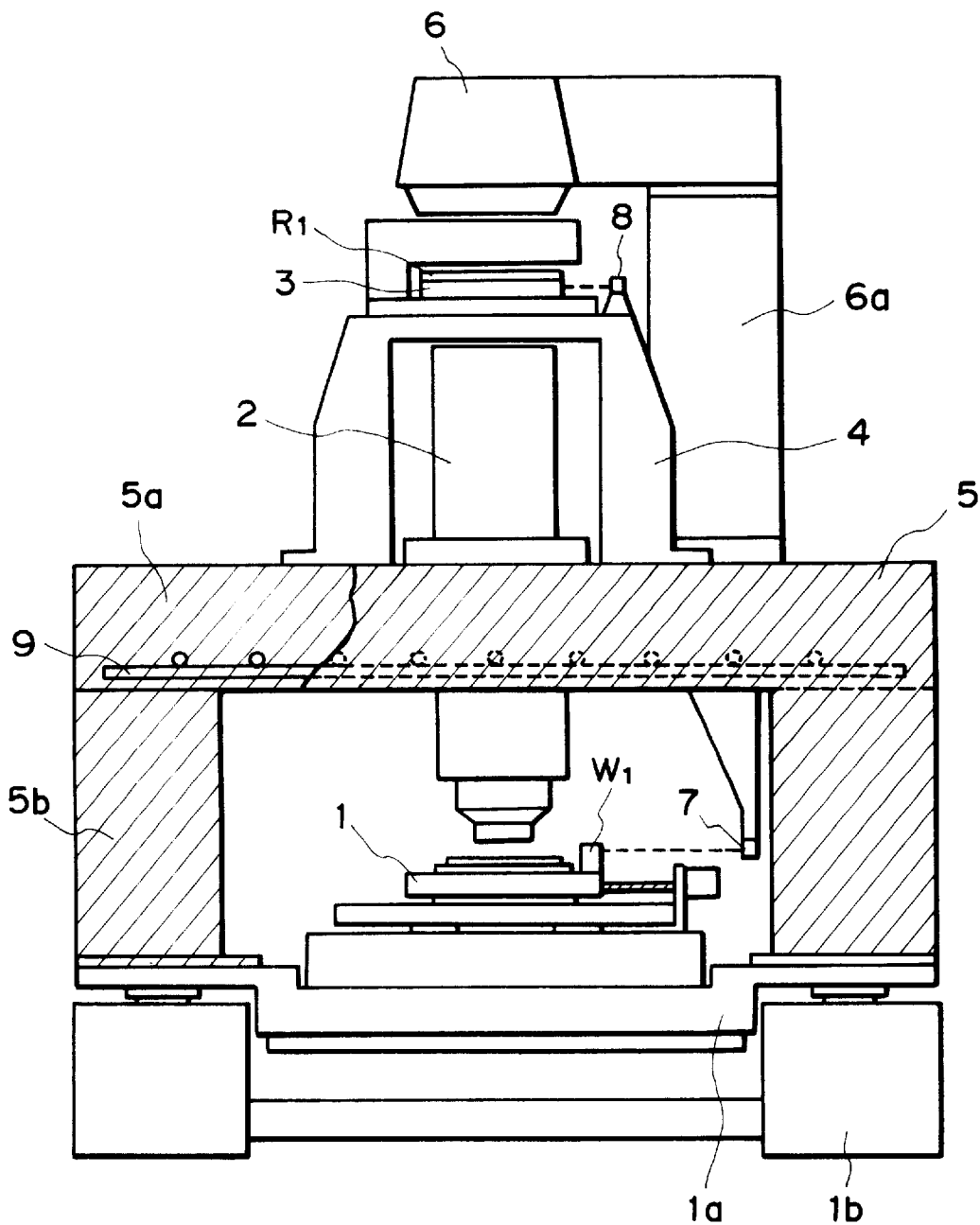
FIG. 1 is an elevational and sectional view of a projection exposure apparatus according to a first embodiment of the present invention.

FIG. 1 is an elevational view of a projection exposure apparatus according to a first embodiment of the present invention. The exposure apparatus illustrated comprises a wafer stage (substrate stage) 1 for positioning a wafer (substrate) $W_1$, a projection lens (projection optical system) 2 disposed above the wafer stage, a reticle stage (original stage) 3 and a light source optical system 6. The light source optical system 6 produces exposure light which passes a reticle (original) $R_1$ placed on the reticle stage 3. The light is then projected by the projection lens 2 onto the wafer $W_1$, whereby a pattern of the reticle $R_1$ is transferred to the wafer $W_1$.

The wafer stage 1 is supported at the central portion of a base 1a which is supported on the floor (not shown) through an anti-vibration system 1b. At the outside peripheral portion of the base 1, there is a frame member (supporting member) 5 of ceramics supported in an upstanding position. The ceramics frame 5 has a top 5a of a hollow structure to be described later, and four legs 5b integral with the top. The top 5a of the ceramics frame 5 supports the projection lens 2 at the center thereof. Also, the ceramics frame supports at its outer portion a supporting member 4 having a channel-like sectional shape and for supporting the reticle stage 3, as well as an L-shaped supporting member 6a for supporting the light source optical system 6, these members being supported in an upstanding position. In this embodiment, the supporting member depicted by hatching in the drawing is made of a ceramics material.

In this embodiment, in addition to the supporting frame 5, any one of or all of the base 1a, the reticle supporting member 4 and the light source optical system supporting member 6a may be made of a ceramics material. Further, a structural member of the X–Y stage, a structural member of the reticle stage, a barrel of the projection lens, and an interferometer supporting member may be made of a ceramics material.

Inside the top 5a where breaking strength is particularly required, there are steel rods 9 extending longitudinally and laterally at the bottom surface side of the top, this being made to assure strength against an impact load to be applied from above.

Embedding these steel rods 9 may be done together with sintering of the ceramics. Alternatively, after sintering, rod members may be inserted into bores formed beforehand.

Further, elements such as steel rods, for example, having a higher thermal expansion coefficient than ceramics may be combined with ceramics by hot adhesion. On that occasion, in a normal temperature range, a compression force provided by thermal contraction of the steel rods is preloaded to the ceramics. This effectively reduces the tensile stress.

Adhesion of elements in this embodiment may be based on adhesion by simple screwing. Alternatively, it may be based on burning fitting, cast adhesion, an organic adhesive agent, an inorganic adhesive agent, glass fixation, metalizing, or metal welding, for example.

Other adhesion methods such as those based on fused adhesion, liquid-solid reaction adhesion, solid adhesion, or gas-solid adhesion, may be used within the scope of the present invention.

Figure 2:
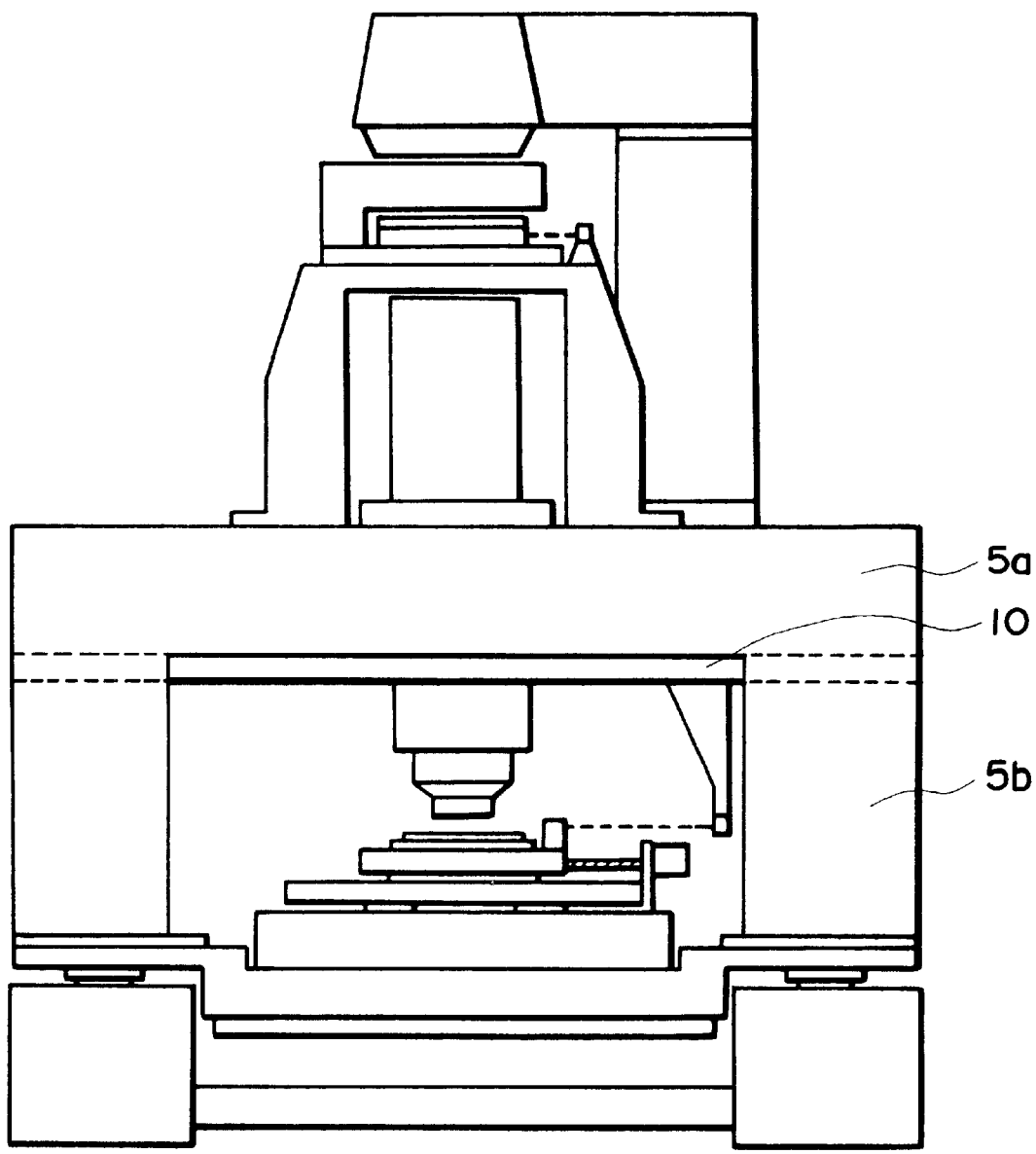
FIG. 2 is an elevational view of a projection exposure apparatus according to a second embodiment of the present invention.

FIG. 2 is an elevational view of a projection exposure apparatus according to a second embodiment of the present invention. While the first embodiment described above uses steel rods mounted inside the ceramics material, an alternative is such as shown in FIG. 2 wherein steel rods or a steel plate 10 or, alternatively, a ceramics material having a higher tensile strength, may be adhered to the bottom surface of the ceramics supporting member 5a. A similar advantageous effect is attainable.

As a further alternative, a ceramics of the same property, having a high purity and fewer pores may be adhered to the surface of the supporting member. This effectively prevents growth of cracks adjacent to the surface, thereby to improve the breaking strength.

Figure 3:
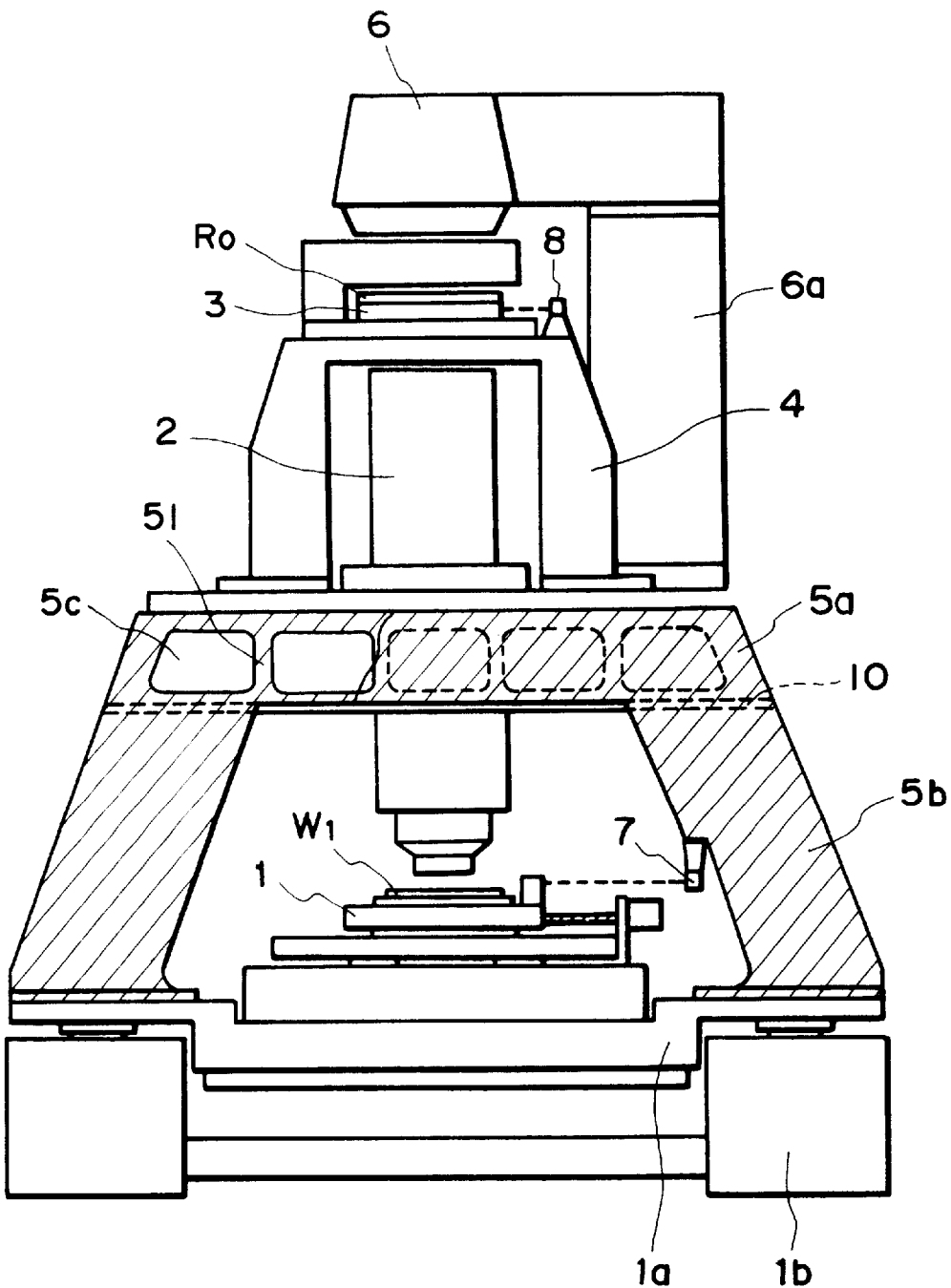
FIG. 3 is an elevational and sectional view of a projection exposure apparatus according to a third embodiment of the present invention.

FIG. 3 is an elevational view of a projection exposure apparatus according to a third embodiment of the present invention. The exposure apparatus of this embodiment has the same structure as that shown in FIG. 1, except for the shape and structure of the frame 5 being made of a ceramics material. Description of common or corresponding elements in this embodiment will be omitted, by assigning corresponding reference numerals to them.

In this embodiment, the supporting member 5 as depicted by hatching is made of a ceramics material. The top 5a where the rigidity is particularly required has a sectional structure as illustrated, wherein a box-like rib structure 51 is provided. This enables a larger section modulus. Also, the modification neutral axis can be defined substantially at the middle position with respect to the thickness of the top 5a. Thus, the tensile stress in the neighborhood of the surface is reduced. In addition to this, a vibration suppressing steel plate 10 having a resin sandwiched therewithin is adhered to the surface of the ceramics material.

Figure 4:
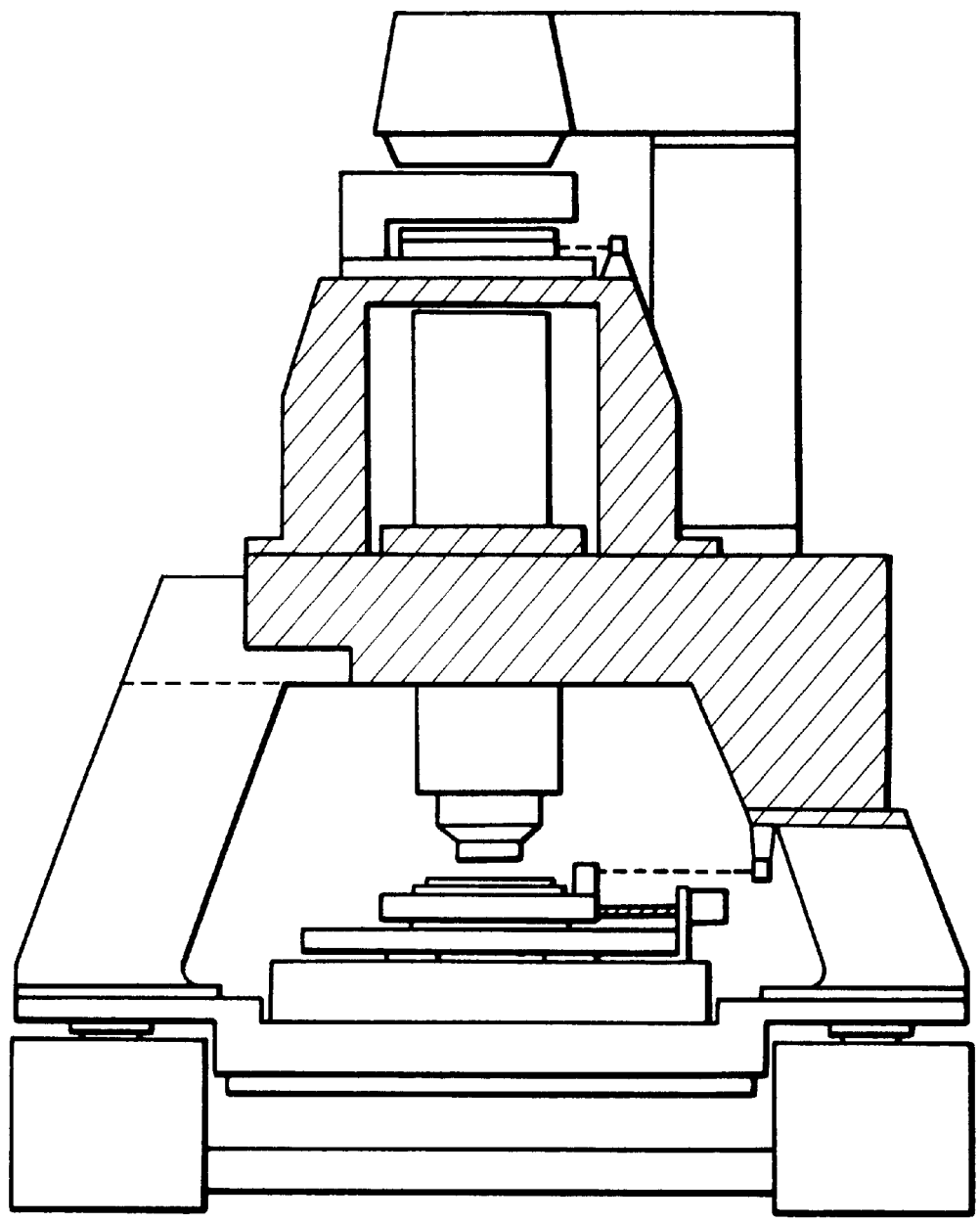
FIG. 4 is an elevational and sectional view of a projection exposure apparatus according to a fourth embodiment of the present invention.

FIG. 4 is an elevational view of a projection exposure apparatus according to a fourth embodiment of the present invention. The exposure apparatus of this embodiment differs from the FIG. 3 embodiment in the point of the structural portion being made of ceramics material. More specifically, in the embodiment of FIG. 4, only the portion as depicted by hatching is made of ceramics. Namely, a ceramics material is used only for important structural portions, i.e., the lens barrel supporting portion, reticle stage supporting portion and laser interferometer mounting portion. The remaining portions are made of cast iron. This is effective to reduce the total cost.

Figure 5:
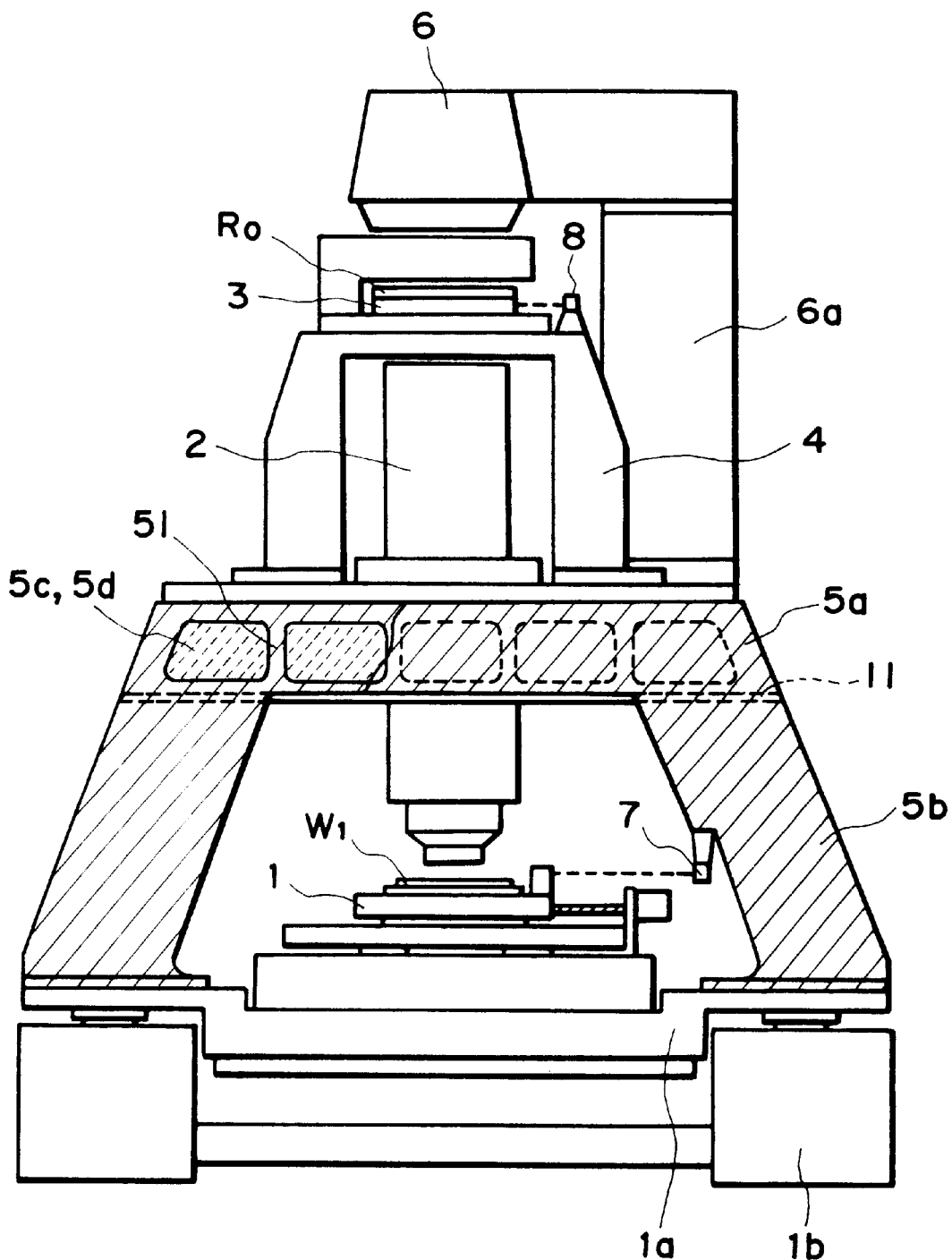
FIG. 5 is an elevational view of a projection exposure apparatus according to a fifth embodiment of the present invention.

FIG. 5 is an elevational view of a projection exposure apparatus according to a fifth embodiment of the present invention. In this embodiment, as compared with the embodiment of FIG. 3, hollow spaces 5c as defined by a box-like rib structure 51 are filled with foamed urethane series resin materials which serve as an attenuating element. By sealingly filling the hollow spaces 5c of the box-like rib structure 51 with foamed urethane resins 5c as described, vibration transmitted through the ceramics can be sufficiently attenuated. As regards the attenuating element, in place of foamed urethane resin, sand-like particles such as sands, silicon rubber, or a liquid material such as a high viscosity oil, for example, may be used.

The surface of the ceramics supporting member may be covered by a rubber series paint material, with substantially the same advantageous effect. Further, a vibration suppressing steel plate 11 having a resin material sandwiched therewithin may be adhered to the surface of ceramics.

Figure 6:
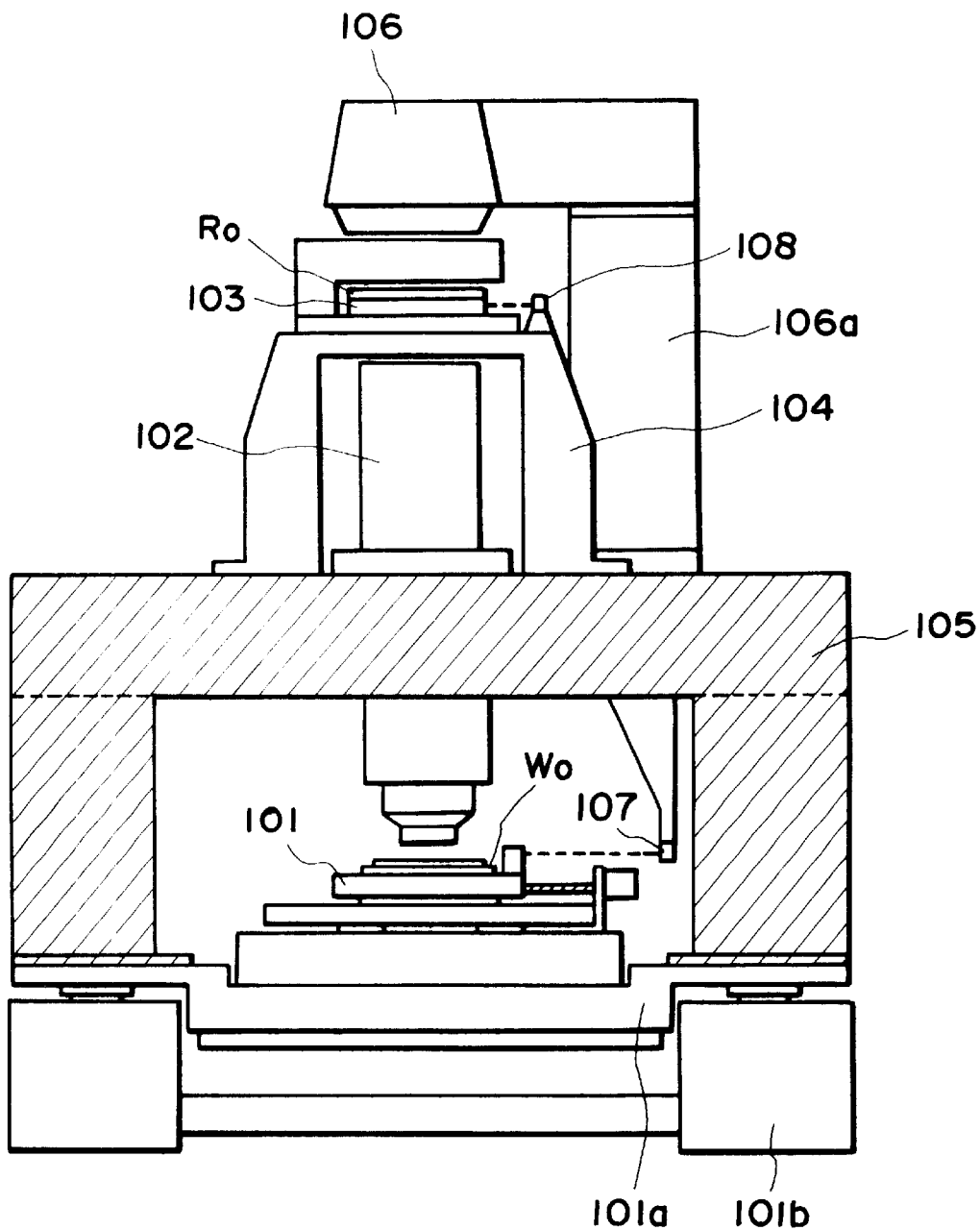
FIG. 6 is an elevational view of a projection exposure apparatus according to a sixth embodiment of the present invention.

FIG. 6 is an elevational view of a projection exposure apparatus according to a sixth embodiment of the present invention. In this embodiment, only the supporting member 5 is made of ceramics. As compared with the embodiment of FIG. 1, in this embodiment, there is no steel rod 9 for reinforcing the ceramics supporting member.

Thus, as described, this embodiment still achieves the basic features of the present invention that, as compared with a supporting frame of the same shape and being made of cast iron, the rigidity is about three times larger and the weight is about a half. Namely, a light weight and high rigidity structure is accomplished.

Next, an embodiment of a device manufacturing method which uses a projection exposure apparatus such as described above, will be explained.

Figure 7:
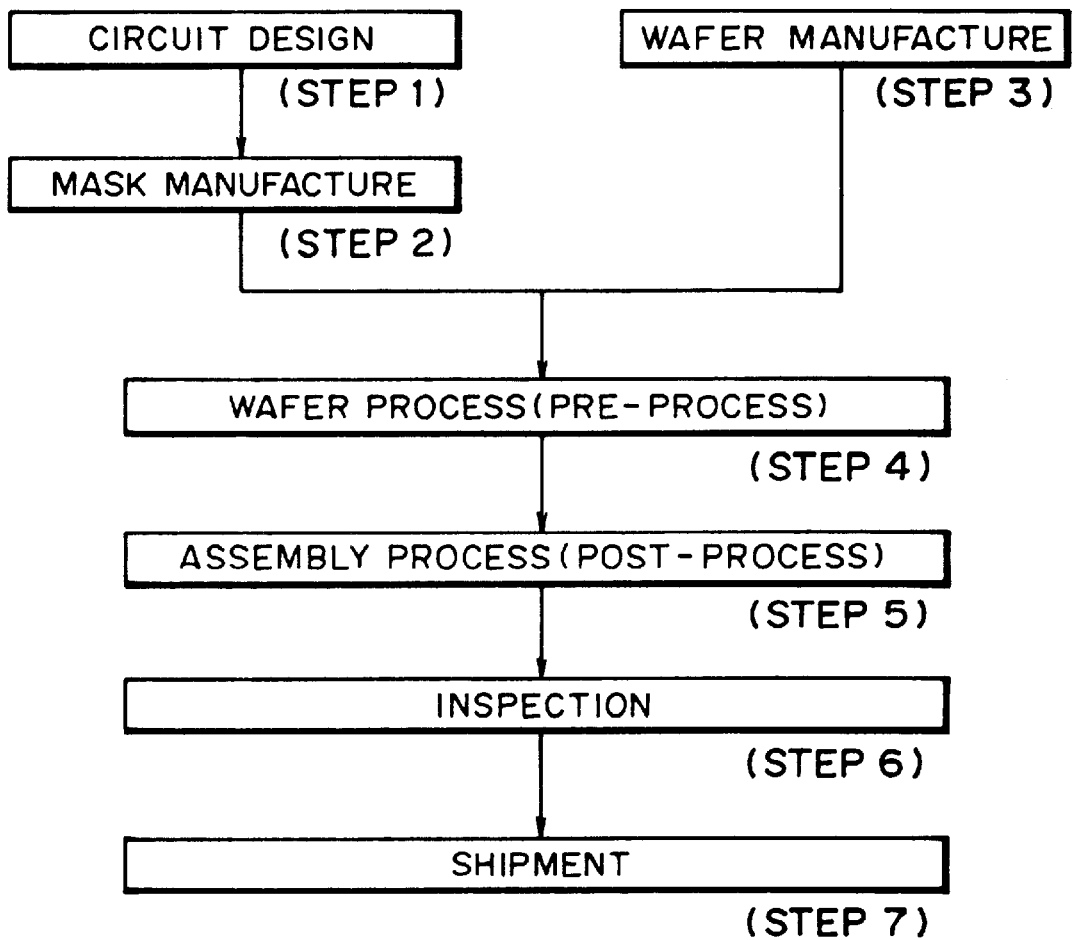
FIG. 7 is a flow chart of semiconductor device manufacturing processes.

FIG. 7 is a flow chart of the procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 8:
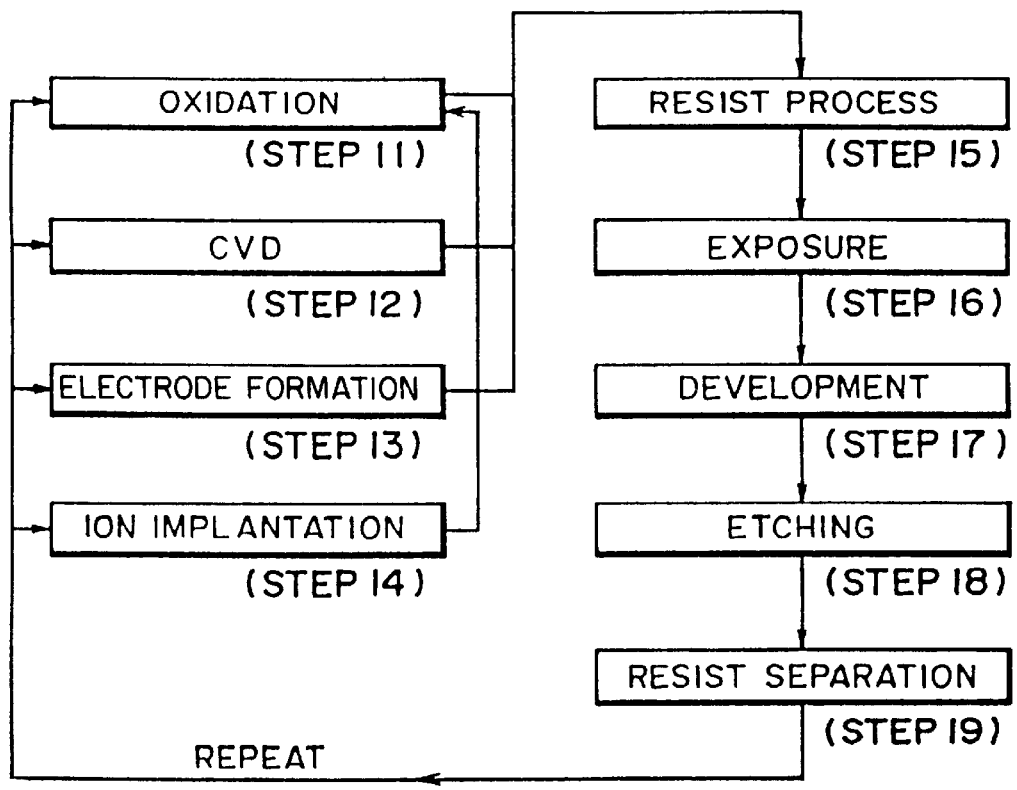
FIG. 8 is a flow chart for explaining details of a wafer process.
Figure 9:
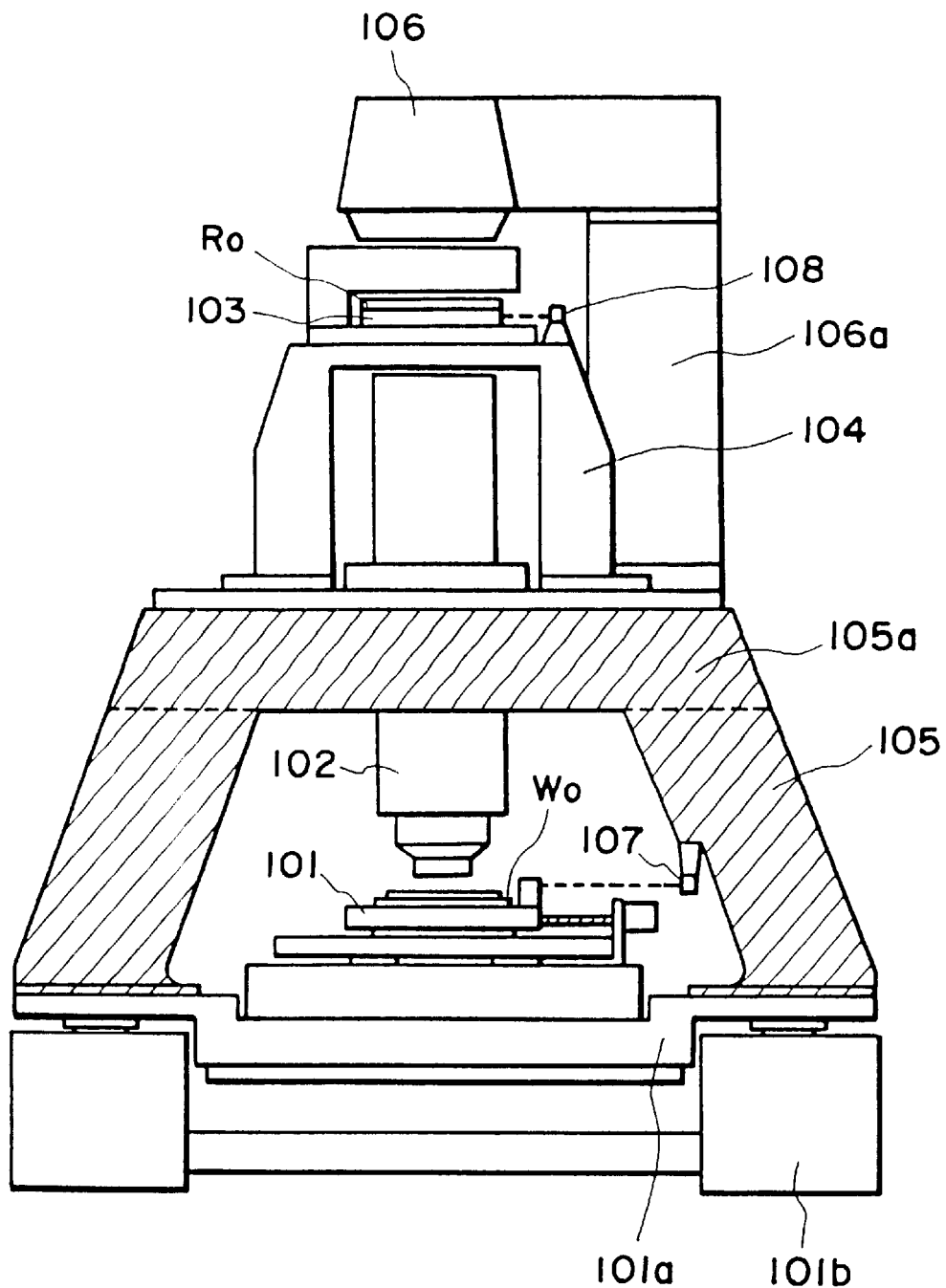
FIG. 9 is an elevational view of a conventional projection exposure apparatus.
Figure 10:
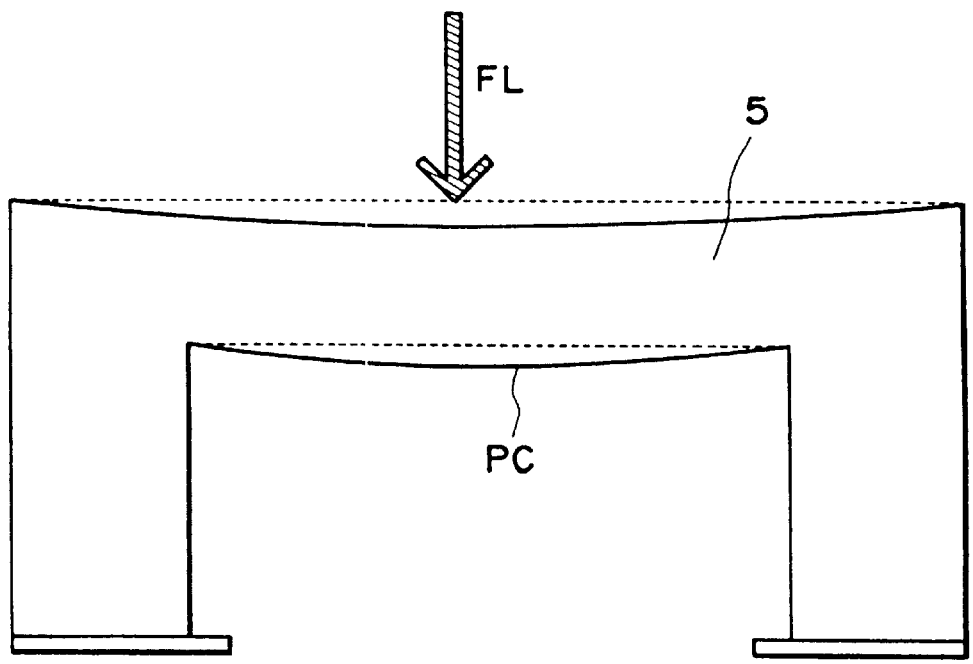
FIG. 10 is a schematic view for explaining a problem involved in the projection exposure apparatus of FIG. 9.

FIG. 8 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with lower cost.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an original table for holding an original having a pattern to be transferred;
   a projection optical system;
   a substrate stage for holding a substrate to be exposed through said projection optical system; and
   a supporting member for supporting said projection optical system, wherein at least a portion of said supporting member is made of a compound material provided by an integral structure of a ceramics material and a metal material, for increasing the rigidity of the supporting member, wherein the metal material is placed inside the ceramics material or adhered to the surface of the ceramics material, and the metal material is pre-stressed so that the metal material applies a compression stress to the ceramics material.

2. An apparatus according to claim 1, wherein the metal material is adhered to the surface of the ceramics material.

3. An apparatus according to claim 1, wherein the metal material is placed inside the ceramics material as a core material.

4. An apparatus according to claim 1, wherein a material having a higher thermal expansion coefficient than the ceramics material is placed inside the ceramics material.

5. An apparatus according to claim 1, wherein another ceramics material; having fewer pores than the ceramics material for said supporting member, is adhered to the surface of the ceramics material for said supporting member.

6. An apparatus according to claim 1, wherein another ceramics material, having a larger tensile strength than the ceramics material for said supporting member; is adhered to the surface of the ceramics material for said supporting member.

7. An apparatus according to claim 1, wherein a portion of said supporting member has an inside hollow space defined therewithin.

8. An apparatus according to claim 7, further comprising an attenuating material included in said inside hollow space.

9. An apparatus according to claim 1, wherein the surface of said supporting member is covered by a vibration absorbing material.

10. An apparatus according to claim 1, wherein said supporting member also supports said substrate stage.

11. An apparatus according to claim 1, further comprising a measuring device for measuring a position of said substrate stage, wherein said supporting member also supports said measuring device.

12. An apparatus according to claim 1, wherein said original table is disposed above said projection optical system, and wherein said supporting member also supports said original table.

13. An apparatus according to claim 1, further comprising a measuring device for measuring a position of the original held on said original table, wherein said supporting member also supports said measuring device.

14. An apparatus according to claim 1, further comprising an illumination optical system disposed above said projection optical system, wherein said supporting member also supports said illumination optical system.

15. An apparatus according to claim 1, wherein the ceramics material of said supporting member is selected from the group consisting of alumina ceramics, silicon carbide, silicon nitride, zirconia, and aluminum nitride.

16. A device manufacturing method, comprising:
   holding, using an original holding table, an original having a pattern to be transferred;
   providing a projection optical system;
   holding, using a substrate stage, a substrate to be exposed through the projection optical system;
   supporting the projection optical system using a supporting member, wherein at least a portion of the supporting member is made of a compound material provided by an integral structure of a ceramics material and a metal material, for increasing the rigidity of the supporting member, wherein the metal material is placed inside the ceramics material or adhered to the surface of the ceramics material, and the metal material is pre-stressed so that the metal material applies a compression stress to the ceramics material; and
   transferring, by exposure through the projection optical system, a pattern of an original onto a substrate to manufacture a device.

17. A method according to claim 16, further comprising a resist coating step for coating a resist onto the substrate, prior to said transferring step.

18. A method according to claim 16, further comprising a developing step for developing an exposed portion of the substrate, after said transferring step.

* * * * *

UNITED STATES PATENT AND TRADEMARK OFFICE
CERTIFICATE OF CORRECTION

PATENT NO. : 6,208,408 B1
DATED : March 27, 2001
INVENTOR(S) : Yukio Takabayashi It is certified that error appears in the above-identified patent and that said Letters Patent is hereby corrected as shown below:

Column 2,
Line 20, "is" should read -- are --; and "has" should read -- have --.
Line 42, "is" should read -- material is --.

Column 7,
Line 7, "material;" should read -- material, --.

Column 8,
Line 3, "member;" should read -- member, --.

Signed and Sealed this

Twenty-ninth Day of January, 2002

Attest:

JAMES E. ROGAN
Attesting Officer    Director of the United States Patent and Trademark Office